United States Patent
Blackall et al.

(10) Patent No.: US 7,323,793 B2
(45) Date of Patent: Jan. 29, 2008

(54) SYSTEM AND METHOD FOR DRIVING ONE OR MORE LOADS

(75) Inventors: Eric C. Blackall, Richardson, TX (US); David J. Baldwin, Allen, TX (US); Patrick P. Siniscalchi, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 288 days.

(21) Appl. No.: 10/740,998

(22) Filed: Dec. 19, 2003

(65) Prior Publication Data

US 2005/0134118 A1 Jun. 23, 2005

(51) Int. Cl.
*H02J 1/00* (2006.01)
*H02J 1/04* (2006.01)
*H02J 3/00* (2006.01)
*H02J 3/10* (2006.01)

(52) U.S. Cl. .......................................................... 307/33
(58) Field of Classification Search ................... 307/33
See application file for complete search history.

(56) References Cited

U.S. PATENT DOCUMENTS

| | | | | |
|---|---|---|---|---|
| 4,463,274 A | * | 7/1984 | Swartz | 327/513 |
| 5,744,984 A | * | 4/1998 | Drapac et al. | 327/89 |
| 6,963,175 B2 | * | 11/2005 | Archenhold et al. | 315/291 |

* cited by examiner

*Primary Examiner*—Michael Sherry
*Assistant Examiner*—Carlos Amaya
(74) *Attorney, Agent, or Firm*—William B Kempler; W. James Brady, III; Frederick J. Telecky, Jr.

(57) ABSTRACT

A system and method for driving a load at a desired operating level. A driver is connected to a load. The load can be selected from a plurality of loads by a selection system, such as a multiplexer, or a single load can be utilized. Feedback from the load is provided to the driver for achieving the desired operating level. A zero temperature coefficient resistance formed by two resistors having different resistances can be used so that the driver emulates an ideal resistor having a substantially zero temperature coefficient, providing a temperature independent current to the load.

13 Claims, 3 Drawing Sheets

SYSTEM AND METHOD FOR DRIVING ONE OR MORE LOADS

TECHNICAL FIELD

The present invention relates generally to electrical circuits, and more particularly systems and methods for driving multiple loads.

BACKGROUND OF THE INVENTION

Sensor bridges elements can be utilized for sensing a given parameter, such as pressure, acceleration, torque or the like. The sensor bridge provides a differential output signal indicating the sensed parameter. The sensor bridges usually provide the output signal to associated circuitry (e.g. an application specific integrated circuit (ASIC)) for conditioning the bridge signal. The associated circuitry provides a conditioned signal to other control circuitry.

The operating parameters for a sensor bridge can vary as a function of circuit operation, temperature or other environmental factors. These fluctuations in the operating parameters may cause inaccurate sensor readings. Various approaches have been utilized to compensate for sensor inaccuracies, including those relating to environmental factors (e.g., temperature) in a variety of sensors. One approach is to employ a trimmed resistor associated with the sensor bridge to provide desired compensation for the sensor bridge.

In view of existing approaches, there is still a need for improvements in compensation for sensor bridges.

SUMMARY OF THE INVENTION

One aspect of the present invention provides a system for selectively driving a plurality of loads. The system includes a variable driver and a selection system for coupling the driver to drive a selected one of a plurality of loads. A feedback path from the selected one of the plurality of loads can be provided to the variable driver for compensating for error caused by the selection system. The driver can also be implemented to include a combination of at least two resistors with different temperature coefficients trimmed to form a zero temperature coefficient resistance.

Another aspect of the present invention provides a method for driving a plurality of associated loads. The method can include setting the temperature compensation for the driver and selecting a desired one of the associated loads. The associated loads, for example, can be resistive bridges, such as sensor bridges. A trimming ratio can be set to provide an output voltage to the load at a desired level. The method can also include selecting a trimmed combination of resistors in a driver to provide a composite, zero temperature coefficient resistance at the input of the selected load.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention is directed to systems and methods for driving a load. A system in accordance with an aspect of the present invention can be configured to emulate a resistor having a substantially zero temperature coefficient. A driver can be connected to drive a selected one of the loads at a desired level. To compensate for effects of the selection system (e.g., resistance), a feedback can be provided from the selected load to the driver. For example, a selection system, such as a multiplexer, can be used to couple the selected load to the current source.

In accordance with another aspect of the present invention, the driver can be configured to have a substantially zero-temperature coefficient. The substantially zero-temperature coefficient can be obtained from a trimmed combination of resistors that have different temperature coefficients to form a composite, substantially zero-temperature coefficient resistance. The driver can be utilized to drive a single connected load or alternatively, load selected from a plurality of loads.

Figure 1:
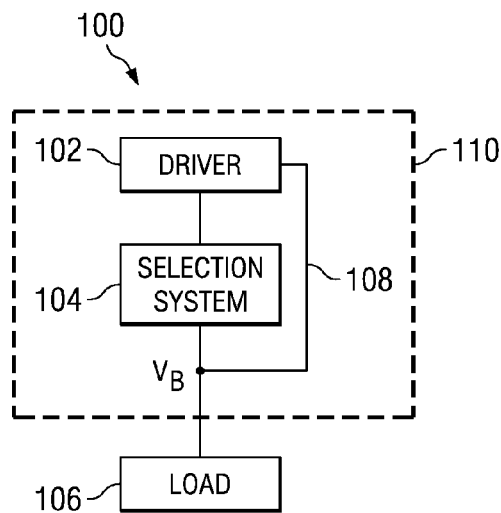
FIG. 1 is a block diagram that illustrates a system in accordance with an aspect of the present invention.

Referring to FIG. 1, there is a system 100 in accordance with an aspect of the present invention. The system 100 includes a driver 102 coupled via a selection system (e.g., multiplexer) 104 to load 106. Alternatively, where a single load is employed in the system 100, the driver can be directly coupled to the load 106. A voltage, $V_B$, at a node associated with the load is fed back to driver 102 along feedback path 108. The driver 102 is configured to maintain $V_B$ at a desired level.

For example, driver 102 can include a variable current source that provides a current to maintain the desired $V_B$. Driver 102 can alternatively be a voltage source. Driver 102 can have a trimmed combination of resistors having different temperature coefficients to form a zero temperature coefficient resistance. Driver 102 thus can be configured to emulate an ideal resistor having a substantially zero temperature coefficient. In addition, when driver 102 includes a current source, driver 102 can have at least one current mirror. The current mirror can have a trimming ratio that is adjustable by selecting at least one of a plurality of transistors (e.g., from a transistor bank) to be connected to one side of the current mirror. A control (not shown) can be used to select the at least one transistor as a function of the load selected by the selection system 104. As a result, a different trimming ratio can be provided for each of the plurality of loads 106 so as to help maintain a desired $V_B$.

Selection system 104 selectively couples the driver 102 to the selected load 106. Selection system 104 can include for two multiplexers for connecting a selected one of the loads with driver 102. For example, one multiplexer can be employed for connecting the load 106 to the driver 102, and the other for selectively providing feedback to driver 102 by connecting a node of the selected load 106 to variable source 102.

Load 106 can be a resistive bridge. For example, load 106 can include a plurality of sensor bridges in which the resistance of each bridge changes as a function of the parameter being sensed. For instance, each resistive bridge can be configured to have a resistance that varies as a function of a parameter being sensed (e.g., temperature, pressure, and the like). The output signal across the selected load can be provided to associated control circuitry (not shown). Those skilled in the art will understand and appreciate various types of sensors and bridges that can be utilized.

Driver 102 and selection system 104 can be implemented as an integrated circuit (IC) 110. IC 110 is configured to emulate an ideal variable resistor that is biased to provide a substantially fixed $V_B$ to the selected load 106. Additionally, components in the driver 102 can be trimmed to provide a substantially zero temperature coefficient resistance for IC 110, such as to afford desired temperature compensation at the output of the selected load 106.

Figure 2:
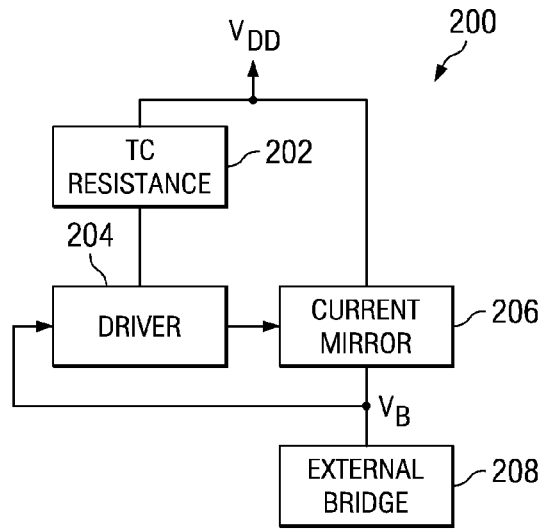
FIG. 2 is a block diagram that illustrates a system with temperature compensation in accordance with an aspect of the present invention.

Referring to FIG. 2, there is illustrated a system 200 in accordance with an aspect of the present invention. A voltage source, $V_{DD}$ is used to provide power to a temperature coefficient (TC) resistance 202 that is coupled to driver 204. TC resistance 202 can be a substantially zero-TC resistance. The zero-temperature coefficient resistance 202 can be obtained from a trimmed combination of resistors that have different temperature coefficients that are arranged to form a composite, substantially zero-temperature coefficient resistance 202. By placing the composite, zero-temperature coefficient resistance between $V_{DD}$ and driver 204, the voltage across TC resistance 202 provides a temperature independent current for driver 204. Driver 204 thus can be configured to emulate an ideal resistor having a substantially zero temperature coefficient.

Driver 204 provides a bias to current mirror 206. Current mirror 206 also receives power from $V_{DD}$. Current mirror 206 can have an adjustable trimming ratio. The trimming ratio can be adjusted by one or more transistors from a plurality of transistors. For example, a transistor bank (or network) connected to the current mirror can be programmed to set a desired trimming ratio by employing one or more transistors. The trimming ratio can be different for each of the plurality of loads 106 so as to help maintain a desired bias voltage ($V_B$) at the load.

Current mirror 206 is connected to an external bridge 208. The external bridge 208, for example, can be a single resistive bridge (e.g., a sensor) or a plurality of resistive bridges. As shown, $V_B$ is between current mirror 206 and bridge 208, and is fed back to driver 204. By providing feedback from $V_B$ to driver 204, driver 204 can be adjusted to drive external bridge 208 at a desired level. If $V_B$ is the voltage of driver 204, then the current across TC resistance 202 is $(V_{DD}-V_B)$/TC Resistance.

Figure 3:
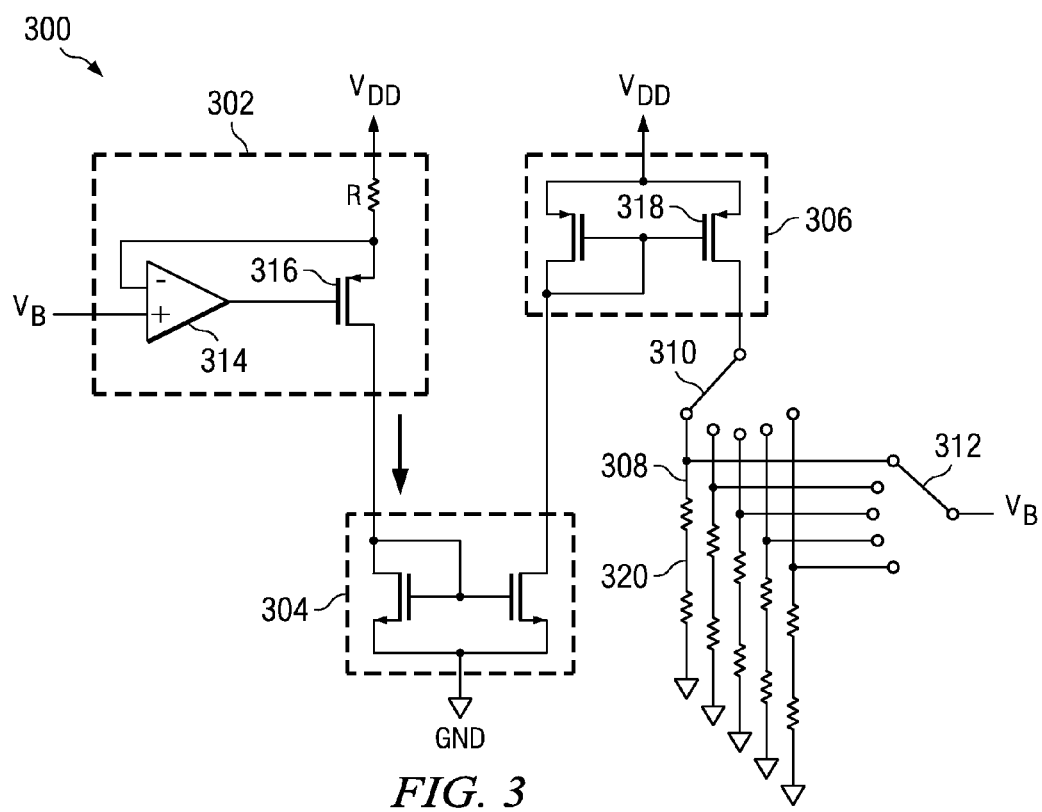
FIG. 3 is a circuit diagram that illustrates a multiple sensor bridge drive in accordance with an aspect of the present invention.

Referring to FIG. 3, there is illustrated a circuit diagram for a system 300 in accordance with an aspect of the present invention. The system 300 can employ a single driver 302 to drive a selected one of a plurality of loads.

Driver 302 can be implemented as a current source for driving the loads. Driver 302 comprises an amplifier 314, driving a transistor 316. A bias voltage, $V_B$ from the load is input into the non-inverting input of amplifier 314. The inverting input of amplifier 314 is coupled to a node between a resistor R and transistor 316. Driver 302 can provide bias current to a current mirror network that includes current mirrors 304 and 306. In the example of FIG. 3, the current flow through resistor R can be defined by $(V_{DD}-V_B)/R$.

Resistance R can be a trimmed combination of resistors, each having a different temperature coefficient to form a substantially zero temperature coefficient resistance. The trimmed combination of resistors may be formed by least two resistors, where the first resistor has a positive temperature coefficient and the second resistor has a negative temperature coefficient. Using a substantially zero temperature coefficient resistance enables a temperature independent current to flow through R.

The output of amplifier 314 biases transistor 316. The current flowing through transistor 316 is provided to current mirror 304. This causes a proportional current to flow through second current mirror 306 to a selected load 308. Current mirror 306 has a trimmed ratio that can be selectively adjusted by changing transistor 318. For example, transistor 318 can be one or more transistors selected from a transistor bank. The selection of transistor 318 can be a function of the load 308 selected by a selection system 310. By selectively adjusting the trimmed ratio of transistor 318, the system can maintain a desired $V_B$.

The current through transistor 318 is sent to selection system 310. Selection system 310 can be implemented as a multiplexer 310 for coupling current mirror 306 to the selected load 308. Another selection system 312 can be employed to obtain the voltage $V_B$ associated with the selected load 308 and feed back the voltage to amplifier 314. Obtaining $V_B$ on the sense element side of selection systems 310 and 312 mitigates errors introduced by multiplexers 310 and 312. Selection systems 310 and 312 can be connected to the same load. Although selection system 312 is shown as connected to the same node of load 308 as the force multiplexer, it can be appreciated that selection system 312 can be connected to any node of the selected load 308.

Figure 4:
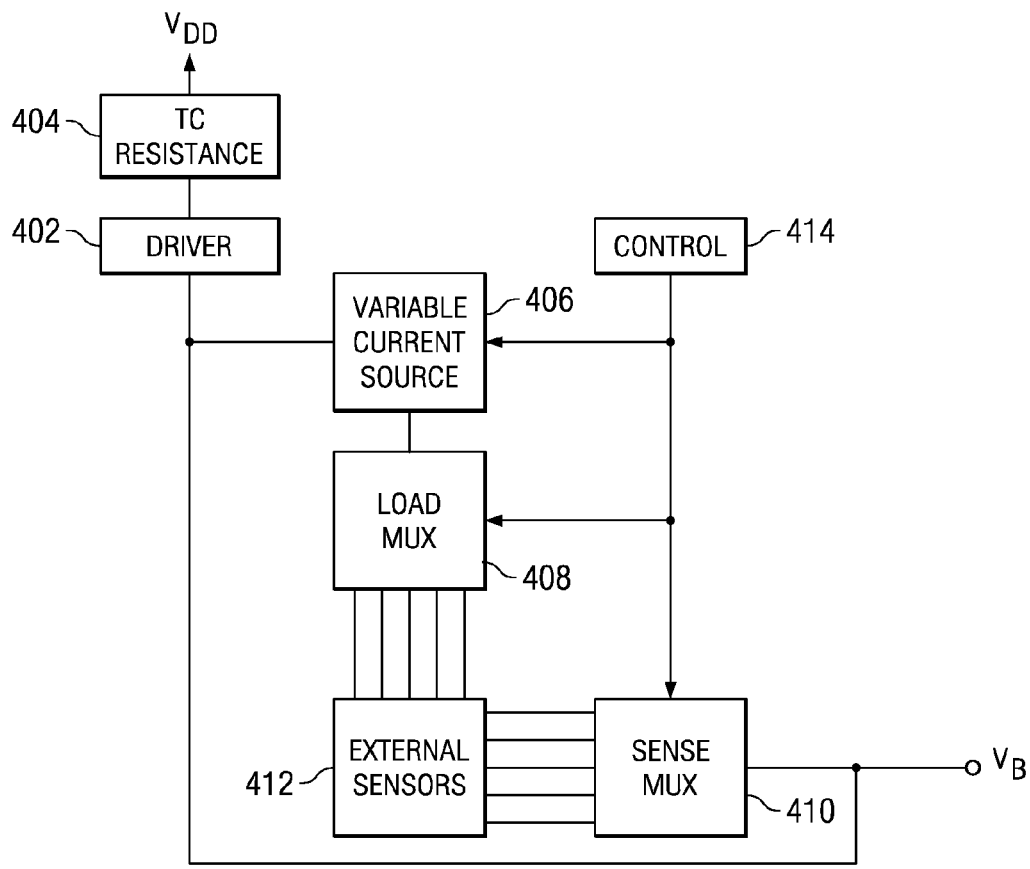
FIG. 4 is a block diagram that illustrates a multiple bridge sensor with temperature compensation in accordance with an aspect of the present invention.

FIG. 4 illustrates a block diagram of a system 400 in accordance with another aspect of the present invention. A driver 402 is connected to power source $V_{DD}$ via temperature coefficient (TC) resistance 404. TC resistance 404 can be a trimmed combination of resistors, each having a different temperature coefficient and operative to form a substantially zero temperature coefficient resistance. By using a substantially zero temperature coefficient resistance, a temperature independent current can flow through TC resistance 404.

Driver 402 provides a bias to variable current source 406. Variable current source 406 can comprise a current mirror network (not shown) which can provide a current that is proportional to the current received from driver 402. The current from variable current source 406 is provided to multiplexer 408. Multiplexer 408 selects a load from a plurality of external sensors 412 to be driven. A sense multiplexer 410 is operated to sense a voltage $V_B$ at a node of the external sensor. $V_B$ is provided as feedback to driver 402. Obtaining $V_B$ from sense multiplexer 410 mitigates errors introduced by multiplexers 408 and 410. Additionally, the feedback enables the circuiting 402, 404 and 406 to emulate an ideal zero temperature coefficient resistance that varies as a function of the selected sensor 412. While a plurality of external sensors 412 are depicted in FIG. 4, it will be appreciated that a single sensor bridge could be utilized, with the multiplexers 408 and 410 omitted from the system 400.

Control 414 is coupled to variable current source 406, multiplexer 408, and sense multiplexer 410. Control 414 can be a controller (e.g., digital or analog) for selecting a desired one of the external sensors 412. Control 414 sets the appropriate select lines for multiplexer 408 to couple the selected sensor to the variable current source 412. In addition, control 414 can set the select line for sense multiplexer 410 to obtain $V_B$ from the selected node. Furthermore, when variable current source 406 comprises a current mirror with an adjustable trimming ratio, control 414 can also set the trimming ratio as a function of the selected sensor, such as by selecting at least one transistor from a transistor bank on at least one side of the current mirror. Control 414 can provide a single multi-bit output signal the concurrently controls variable current source 406, multiplexer 408 and sense multiplexer 410. As a result, variable current source 406 can provide a different bias for each of the plurality of external sensors 412 so as to help maintain a desired $V_B$.

Figure 5:
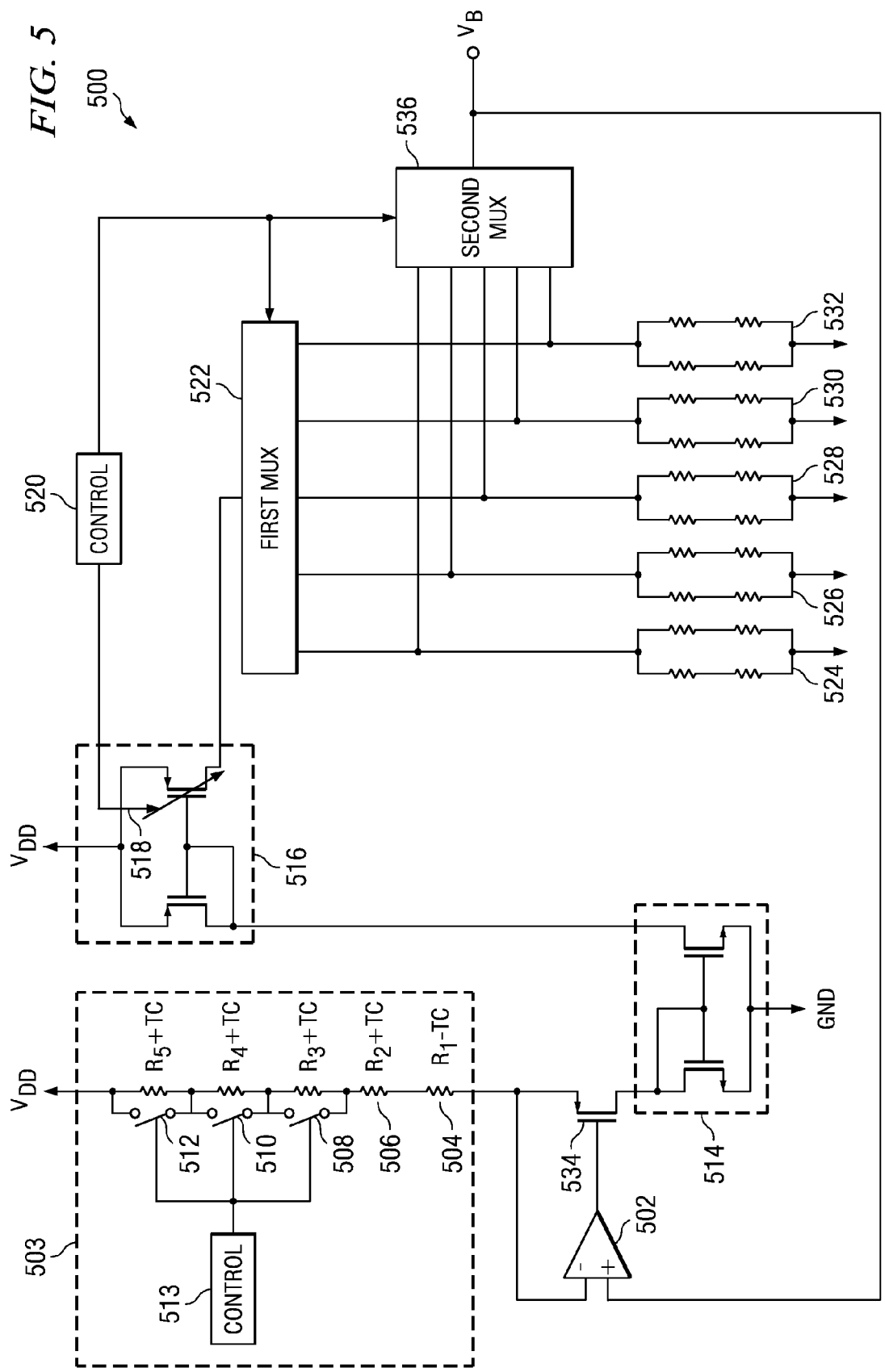
FIG. 5 is a circuit diagram illustrating a multiple bridge drive with temperature compensation in accordance with another aspect of the present invention.

FIG. 5 depicts a circuit diagram of a system 500 in accordance with an aspect of the present invention. The driver comprises amplifier 502, an associated resistive network 503, and current mirrors 514 and 516.

Amplifier 502 drives an associated transistor 534 based on a level of feedback $V_B$, received from a selected one of a plurality of loads 524, 526, 528, 530 and 532. Current flows from power source $V_{DD}$ to transistor 534 through a resistive network 503. The resistive network 503, for example, provides a substantially zero-temperature coefficient resistance. The resistive network includes resistors 504, 506, switches 508, 510 and 512 and resistors associated with the respective switches. A control 513 is operative to control the switches 508, 510 and 512 to set a resistance that forms a substantially zero temperature coefficient resistance.

For example, resistor 504 has a negative temperature coefficient (−TC) and resistor 508 has a positive temperature coefficient (+TC). The resistors having different TC's, for example, can be made with different types of polysilicon. The composite, zero temperature resistance can be trimmed by opening or closing switches 508, 510 and 512. Each of switches 508, 510, 512 is connected in parallel to a trimmed resistance of R+TC. Therefore, the opening of a switch 508, 510, 512 causes an additional trimming resistance of R+TC $R_4$+TC, $R_5$+TC to be added to the resistive network 503, and closing a switch 508, 510, 512 shorts out the resistor. The value of the resistors coupled to switches 508, 510, 512 can be chosen so that the total positive temperature coefficients (TC) balance the negative temperature coefficient (−TC). Alternatively, resistors having negative TC could be switched in conjunction with a positive TC resistor.

First control 513 can be used to set switches 508, 510 and 512 during calibration of the system 500. Such calibration can be performed by the manufacturer such as part of a burn-in process. Thus, the driver, comprising amplifier 502 and current mirrors 512, 514 can be configured to emulate an ideal resistor having a substantially zero temperature coefficient.

A temperature independent current flows through the composite substantially zero temperature coefficient resistance provided by the resistive network 503. This current is equal to the voltage across the composite, zero temperature coefficient resistive network 503 divided by the resistance. For example, if switches 508, 510 and 512 are closed, the temperature independent current can be defined by $(V_{DD}-V_B)/(R+TC+R-TC)$ or $(V_{DD}-V_B)/2R$. The current is trimmed by a factor of 1/(R+TC) for each of switches 508, 510 and 512 that are opened. Resistors 504 and 506, R+TC resistances in parallel with switches 508, 510 and 512, and switches 508, 510 and 512 can be implemented in the same integrated circuit as the amplifier 502, eliminating the need for external trimming components.

The output of amplifier 502 is input into transistor 534. The current flowing through transistor 534 biases current mirror 514. This causes a current to flow through the second current mirror 516. Current mirror 516 has a trimmed ratio that can be changed by adjusting transistor 518. Transistor 518 can be one or more transistors selected from a transistor bank. The selection of transistor 518 can be a function of the load, 524, 526, 528, 530 or 532 selected by the first multiplexer 522. As a result, a different trimming ratio can be provided for each of the plurality of loads 524, 526, 528, 530, 532 so as to maintain a desired bias ($V_B$). The current through transistor 518 is provided to a selection system.

The selection system comprises first multiplexer 522 and second multiplexer 536. First multiplexer 522 selectively connects transistor 518 to a selected one of a plurality of resistive loads 524, 526, 528, 530 and 532, such as bridge sensors. Second multiplexer 536 selectively provides feedback from the selected load as $V_B$ to input of amplifier 502. Second multiplexer 536 and first multiplexer 522 can be connected to the same load. Second multiplexer 536 is shown as connected to the same node of loads 524, 526, 528, 530 and 532 as first multiplexer 522, it can be appreciated that second multiplexer 536 can be connected to any node of loads 524, 526, 528, 530 or 532.

A second control 520 is coupled to transistor 516, first multiplexer 522, and second multiplexer 536. Second control 520 can be a switching system, digital or analog, for selecting one of the loads 524, 526, 528, 530 and 532. Second control 520 sets an appropriate select line for first multiplexer 522 to couple a desired one of the resistive loads 524-532 to the transistor 518. In addition, second control 520 can set the select line for second multiplexer 536 to obtain $V_B$ from a node associated with the selected load. Furthermore, second control 520 can set the trimming ratio of current mirror 514 as a function of the load selected by the first multiplexer 522. For example, control 520 can select at least one transistor from a transistor bank (e.g., which forms transistor 516) Additional trimming could also be implemented with regard to the other current mirror 514.

It will be appreciated that, while a plurality of loads 524, 526, 528, 530 and 532 are depicted in FIG. 5, a single such load could be utilized in the system 500. In such an arrangement, for example, the multiplexers 522 and 536 would be omitted from the system 500 and the control would be programmed to select a fixed trimming ratio corresponding to the impedance of the load.

Figure 6:
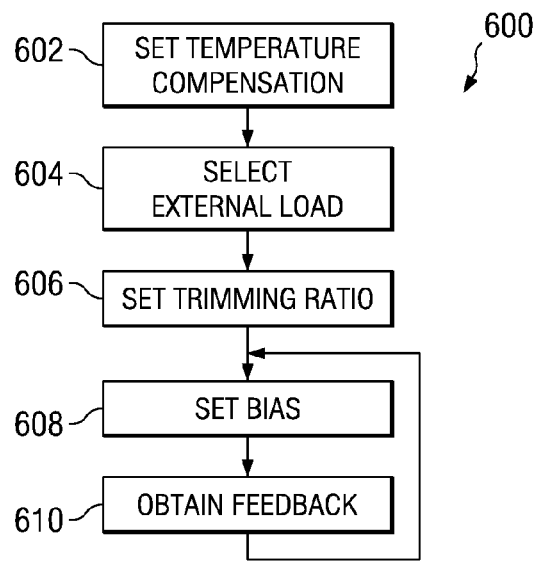
FIG. 6 is a flow diagram of a methodology for a multiple bridge drive with temperature compensation in accordance with an aspect of the present invention.

Referring now to FIG. 6, there is illustrated a methodology 600 in accordance with an aspect of the present invention. While, for purposes of simplicity of explanation, a methodology is shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

The methodology 600 is for driving a selected one of a plurality of loads (e.g., a resistive bridge) to achieve a desired operating point. A signal associated with the selected load is fed back to the driver and the driver adjusts to the desired operating point of the output node based on the feedback signal.

At 602, the temperature compensation for the drive is set. The temperature compensation can be a substantially zero temperature coefficient resistance, which can be formed by combining two or more resistors having different (e.g., opposing) temperature coefficients. For example, if the temperature compensation is formed by two resistors, one resistor can have a negative temperature coefficient, and the other resistor a positive temperature coefficient. Thus, the temperature compensation can be configured so that the driver emulates an ideal resistor having a substantially zero temperature coefficient. The temperature compensation can be set during calibration. During calibration, the sensor and the driver can be at the same temperature, whereas during operation they may be at different temperatures.

At 604, a load (e.g. an external bridge) is selected. A selection system, such as a multiplexer, selects a load from a plurality of loads and couples the load to the driver. At 606, a trimming ratio is set as a function of the load selected at 604. For example, if the current source comprises a current mirror, the trimming ratio can be set by selecting at least one transistor from a transistor bank to obtain a desired ratio from the current mirror. A different trimming ratio can be provided for each of the plurality of loads so as to help maintain a desired bias point (e.g., a bias voltage $V_B$) for each respective load. At 608, the bias is set. A current source provides current to the load to achieve the desired operating point (for example a bias voltage $V_B$). At 610, feedback is obtained to enable the driver to adjust the current being provided to the load in order to achieve the desired operating point $V_B$. Because the operating environment can change, e.g. the ambient temperature, the bias setting can be frequently adjusted based on the feedback.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system, comprising:
   a variable driver;
   a selection system for coupling the driver to drive a selected one of a plurality of loads at a desired level; and
   a feedback path from a node at the selected one of the plurality of loads to the variable driver to compensate for error introduced by the selection system and for achieving the desired level, wherein, the variable driver and the selection system comprising as an integrated circuit configured to emulate an ideal resistor having a substantially zero temperature coefficient resistance, the plurality of loads being external to the integrated circuit.

2. The system of claim 1, each of the plurality of loads further comprises a resistive bridge.

3. The system of claim 1, each of the plurality of loads further comprises a sensor having a resistance that varies as a function of a sensed parameter.

4. The system of claim 1, the selection system further comprises:
   a first multiplexer for connecting the selected one of the plurality of loads to the driver; and
   a second multiplexer for selecting a node of the selected load for the feedback path.

5. The system of claim 1, the driver further comprises:
   a combination of at least two resistors having opposing temperature coefficients trimmed to form a zero temperature coefficient resistance; and
   a variable current source with at least one current mirror, the at least one current mirror having a trimming ratio that is adjustable by selecting at least one of a plurality of transistors to be connected to form the current mirror.

6. The system of claim 5, further comprising:
   each of the plurality of loads further comprises a sensor;
   the selection system further comprises
   a first multiplexer for connecting the selected one of the plurality of loads to the variable current source and
   a second multiplexer for connecting a node of the selected one of the plurality of loads to the feedback path; and
   a control for controlling the first multiplexer and for selecting at least one of a plurality of transistors for setting the trimming ratio as a function of the selected load.

7. A system for driving an associated load, the system comprising:
   a resistive network comprising at least two resistors having different temperature coefficients trimmed to form a substantially zero temperature coefficient resistance;
   a driver coupled to provide a substantially temperature independent bias based on the substantially zero temperature coefficient resistance; and
   a current source that provides current to the associated load based on the substantially temperature independent bias, the current source having an trimming ratio adjusted based on the associated load, whereby the load perceives the driver system as substantially ideal resistor having a substantially zero temperature coefficient.

8. The system of claim 7, further comprising a feedback path coupling the driver with a node associated with the associated load, such that a substantially constant voltage is provided at the node associated with the associated load.

9. The system of claim 7, wherein the load comprises a plurality of loads, the driver further comprising:
   a selection system for coupling the driver to drive a selected one of a plurality of loads at a desired level;
   a feedback path from a node at the selected one of the plurality of loads to the variable driver to compensate for error introduced by the selection system and for achieving the desired level.

10. A system, comprising:
    variable driver means;
    a selection means for coupling the driver means to drive a selected one of a plurality of loads at a desired level; and
    means for providing feedback from a node at the selected one of the plurality of loads to the variable driver means to compensate for error introduced by the selection means and for achieving the desired level, wherein, the variable driver means and the selection means comprising an integrated circuit configured to emulate an ideal resistor having a substantially zero temperature coefficient resistance, the plurality of loads being external to the integrated circuit.

11. The system of claim 10, each of the plurality of loads further comprises a resistive bridge means.

12. The system of claim 10, each of the plurality of loads further comprises a sensor means having a resistance that varies as a function of a sensed parameter.

13. The system of claim 10, the selection means further comprises:
    a first multiplexer means for connecting the selected one of the plurality of loads to the driver means; and a second multiplexer means for selecting a node of the selected load for the feedback means.

* * * * *